(12) United States Patent  (10) Patent No.: US 7,402,892 B1
Glaser et al.  (45) Date of Patent: Jul. 22, 2008

(54) PRINTED CIRCUIT BOARD FOR CONNECTING OF MULTI-WIRE CABLING TO SURGE PROTECTORS

(75) Inventors: James A. Glaser, Bonham, TX (US);
Justin R. Minchey, Leonard, TX (US);
Kennon B. Porter, Bonham, TX (US)

(73) Assignee: GE Act Communications, Inc., Bonham, TX (US)

( * ) Notice: Subject to any disclaimer, the term of this patent is extended or adjusted under 35 U.S.C. 154(b) by 0 days.

(21) Appl. No.: 09/348,906

(22) Filed: Jul. 7, 1999

(51) Int. Cl.
*H01L 23/58* (2006.01)

(52) U.S. Cl. .................. 257/637; 257/173; 361/824; 361/777

(58) Field of Classification Search .............. 361/118, 361/119, 736, 728, 753, 785, 791, 803, 807–809, 361/760–764, 766, 773–775, 777, 115, 435, 361/634, 652, 642, 656, 781, 824, 833, 837; 174/260, 262, 728, 753, 785, 791, 261; 257/173–174, 257/635, 637, 758, E23.173, E23.153, E23.142
See application file for complete search history.

(56) References Cited

U.S. PATENT DOCUMENTS

| | | | |
|---|---|---|---|
| 4,047,143 A * | 9/1977 | Burden et al. | 337/239 |
| 4,331,839 A | 5/1982 | Baumbach | 179/98 |
| 4,434,449 A * | 2/1984 | Dickey | 361/124 |
| 4,658,327 A | 4/1987 | Hernandez | 361/306 |
| 5,038,467 A * | 8/1991 | Murphy | 29/845 |
| 5,088,939 A | 2/1992 | Shepherd | 439/620 |
| 5,208,723 A * | 5/1993 | Jenne | 361/119 |
| 5,457,593 A * | 10/1995 | Glaser et al. | 361/119 |
| 5,483,409 A | 1/1996 | Heidorn et al. | |
| 5,509,814 A * | 4/1996 | Mosquera | 439/82 |
| 5,548,488 A * | 8/1996 | Hansen | 361/815 |
| 5,757,603 A | 5/1998 | Kapp et al. | |
| 5,777,836 A * | 7/1998 | Price et al. | 361/94 |

(Continued)

FOREIGN PATENT DOCUMENTS

GB 2 017 427 10/1979

(Continued)

OTHER PUBLICATIONS

Drawing entitled "P.C.C. Protection System," LX 8809-34, dated Aug. 22, 1989.

(Continued)

*Primary Examiner*—Thao X. Le
*Assistant Examiner*—Thanh Y. Tran
(74) *Attorney, Agent, or Firm*—Eugene Hyun, Esq.; Steve Midgley, Esq.

(57) ABSTRACT

A printed circuit board assembly for coupling a plurality of surge protectors to multi-line communication cables includes a multi-layer printed circuit board, to which has been mounted at least two cable connectors, having multiple female sockets for receiving standard surge protector modules. The multi-layer printed circuit board includes traces on multiple layers in a manner that a unique signal path exists between each lead in each connector and a predetermined one of the plurality of sockets for receiving surge protector modules. The traces having a width and a copper content sufficient to carry large current surges from induced power signals, by way of example, from a lightning strike, without breaking down.

96 Claims, 6 Drawing Sheets

U.S. PATENT DOCUMENTS

| | | | | |
|---|---|---|---|---|
| 6,083,032 A | * | 7/2000 | Daoud | 439/374 |
| 6,134,093 A | | 10/2000 | Masghati | |
| 6,345,991 B1 | * | 2/2002 | Daoud | 439/82 |

FOREIGN PATENT DOCUMENTS

| | | |
|---|---|---|
| GB | 2 042 833 | 9/1980 |

OTHER PUBLICATIONS

Drawing entitled "P.C. Board Prot. System," LX 8809-34(C) (Sht 1 of 2), dated Oct. 20, 1988.

Drawing entitled "Traces on P.C. Board Prot. System," LX 8809-34(C), (Sht 2 of 2) dated Oct. 20, 1988.

\* cited by examiner

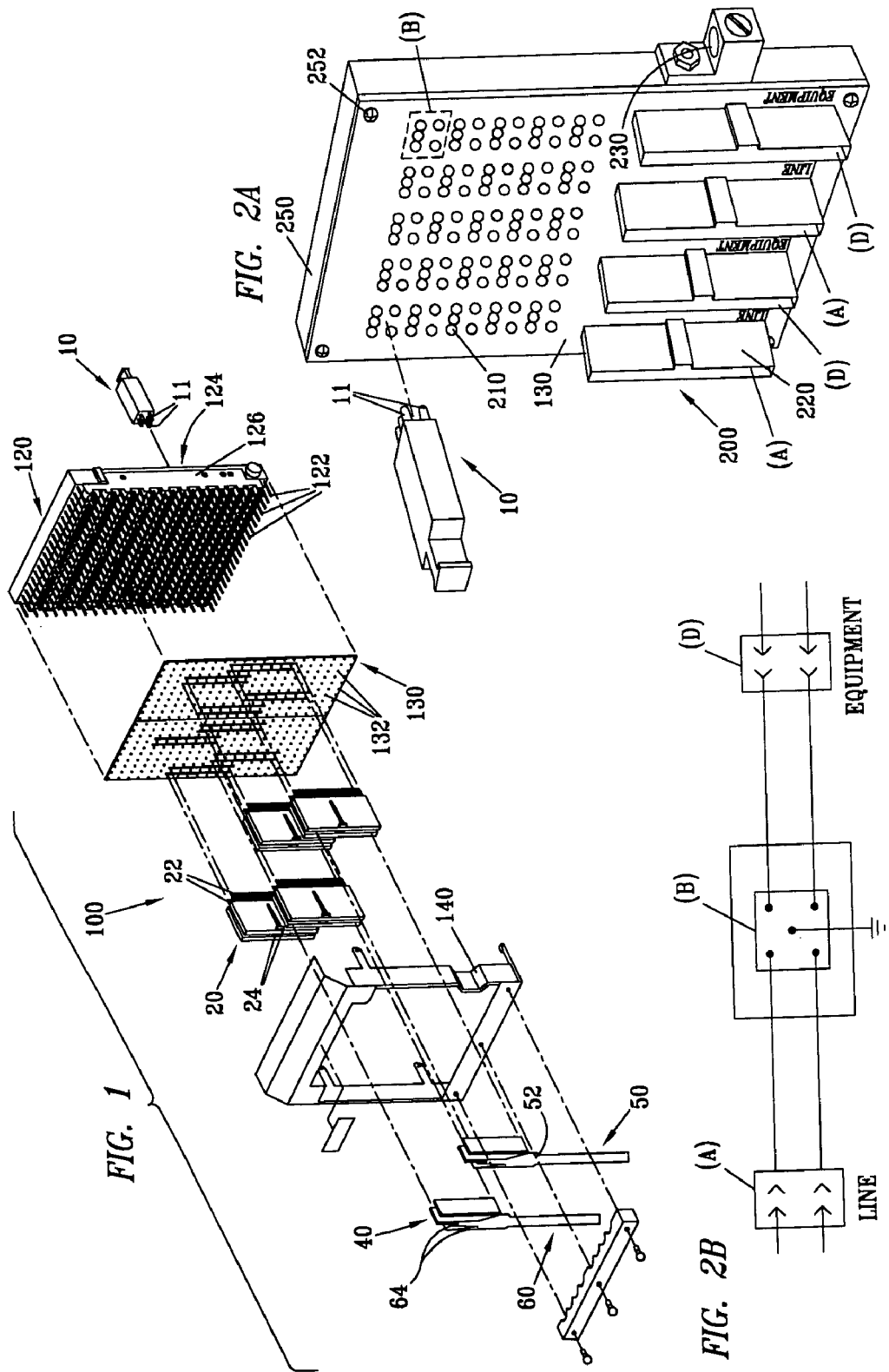

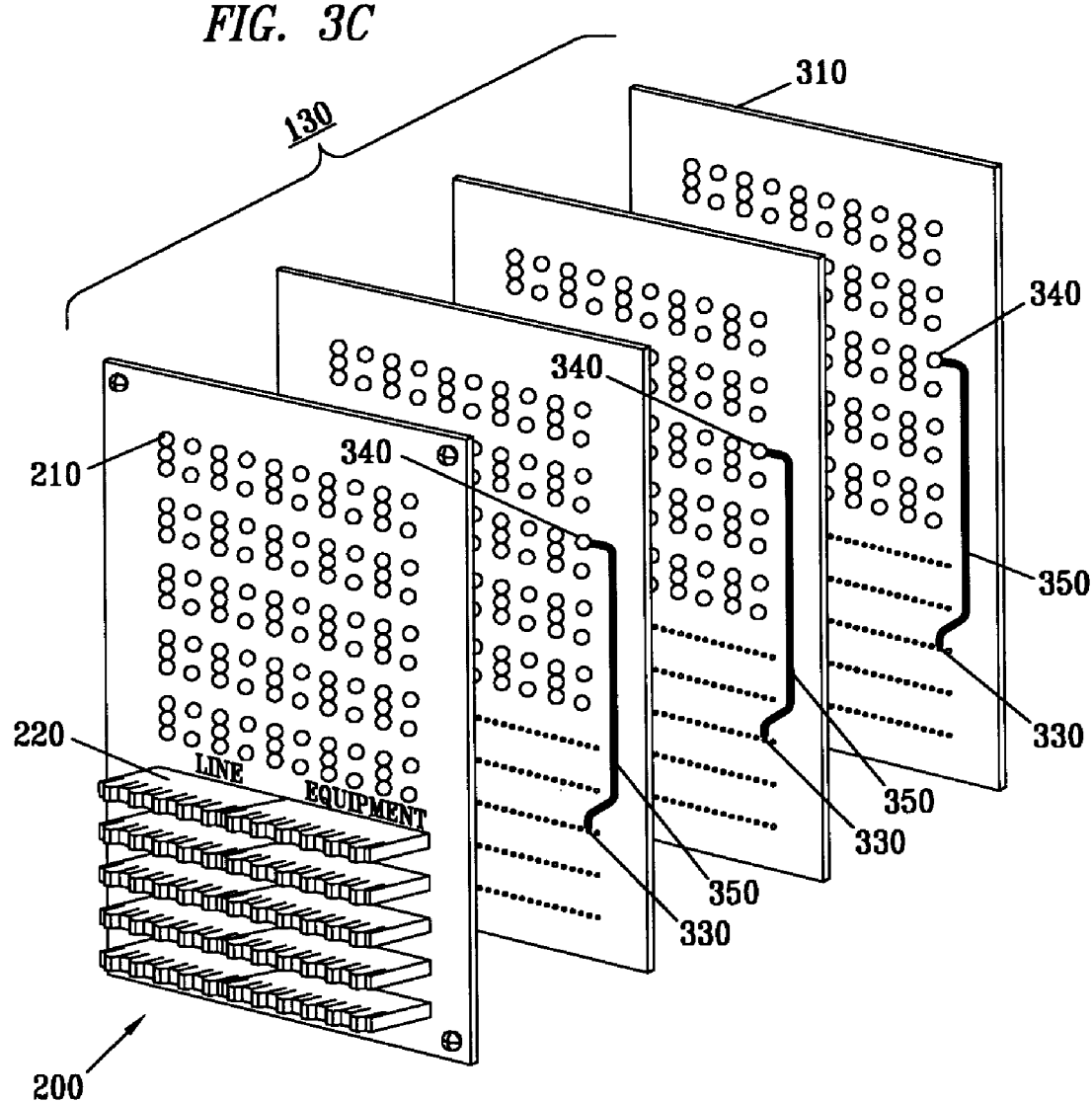

PRINTED CIRCUIT BOARD FOR CONNECTING OF MULTI-WIRE CABLING TO SURGE PROTECTORS

TECHNICAL FIELD OF THE INVENTION

The present invention relates in general to surge protectors for communication cables and, more particularly, to a printed circuit board for connecting of multi-wire cabling to surge protectors.

BACKGROUND OF THE INVENTION

Surge protectors protect voltage sensitive equipment connected to electrical, communications, and signaling lines by discharging high voltage signals or current surges to ground before the high voltage signal can damage the equipment. Communication systems employ large numbers of surge protectors to connect voltage sensitive switching equipment and other equipment to outside cables. Communication lines, which normally carry relatively low voltage message signals, are subject to high current surges caused by lightning and other phenomena associated with the location of the communications lines.

Often, communication lines are bundled for logistic reasons including simplifying line routing. A communication bundle can include over 100 lines. Because of the large number of lines, connecting surge protectors to each of the lines is a labor-intensive task. One conventional device for connecting the communication lines to the surge protectors is a device known as a protector block.

A protector block provides a rigid structural platform for supporting a plurality of surge protector modules for coupling them to multi-line communications cables. Generally, protector blocks come in various sizes, including ones that handle ten, twenty-five, fifty, and one hundred surge protectors for coupling to an equal number of communication line pairs. The design of communication line and protector assemblies is currently limited to the availability of a specific protector block configuration. The protector blocks are rather expensive to produce, making the flexibility of their design rather limited.

A protector block assembly is fabricated as a single slab of plastic insulating material. On one side is a plurality of wire-wrap pins, one for each wire. On the opposite side, there is, for each wire-wrap pin, a female socket electrically connected to the wire wrap pins. The pins and the sockets are typically arranged in groups of five or six, with the pins in each group having a specified configuration depending on the type of surge protector module being used. The pins of the surge protector module, regardless of whether it has a five or six pin configuration, are inserted into the appropriate socket to establish a compression fit electrical connection with the socket and the wire-wrap pin.

There are two conventional methods for connecting communication lines to the protector block: wire wrapping each communication wire that is located within the communication line to the pin on the protector block or terminating multiple wires to a connector and connecting to a mating connector on a connectorized printed circuit board that is flow soldered to the protector block using a conventional flow soldering method known in the art.

After the communication cables are wire wrapped to the protector block, the communication cables are anchored to a metallic or plastic hood that extends over the pins of the protector block. The free end of each cable is usually equipped with a connector so that the entire assembly may be easily connected into a communications system.

In certain applications, there is a need to create a cross-connect between two or more lines of a communication cable. The cross connect allows incoming communication lines to be connected to multiple equipment lines for testing or rerouting communication signals. A conventional device for cross-connecting cables is known as a cross-connect block that is placed in series with the line and/or equipment pins on the protector block. The connections are made by wire-wrapping conductors to the pins of each block. The front side of the cross-connect block is a field of pins or connectors, where communication lines can be connected and disconnected with ease. Typical configurations include the following: wire wrap pins; insulation displacement connectors; and screw down terminals. Again, significant effort is spent wire-wrapping pins to integrate the cross connect block. It is noteworthy that the effort for connecting communication lines to a cross connect is in addition to connecting the communication lines to one protector block.

Alternatively, communication cables may be cross connected by way of a connectorized printed circuit board that is flow soldered to a cross connect block. This solution, however, as well as the use of a cross connect block wire wrap pins limits production rates and generally increases the cost of assembly. In addition, this assembly requires a significant amount of space in the equipment rack or cabinet. There is a need, therefore, for allowing the required connections to be made in a more efficient manner.

SUMMARY OF THE INVENTION

According to the invention, a multi-layer printed circuit board assembly provides a rigid structural platform for supporting a plurality of surge protector modules for coupling to multi-line communications cables on one board. The multi-layer printed circuit board assembly includes a printed circuit board, multiple female sockets and at least two connectors mounted on the printed circuit board.

The multiple female sockets reside in plated through holes within the printed circuit board, and are arranged to accept, align, fit, hold, support, receive, and retain surge protector modules. Each socket forms a compression fit around a surge protector pin and an interference fit between the pin and the plated through hole to create an electrical connection between the corresponding trace and its surge protector pin. This allows the traces within the printed circuit board to electrically connect each lead of a designated communication line with a corresponding surge protector pin.

Each metal trace provides a unique, low resistance electrical connection between one connector pin socket and one protector pin socket. Each metal trace includes multiple runs (for simplicity the term "run" shall be used to refer to each trace when there are multiple traces having common end points). The multiple runs on different printed circuit board layers allow the transfer of large current surges from induced power signal without breaking down. Using runs instead of sufficiently thick individual traces is advantageous in that it is less expensive.

In one embodiment, the invention provides cross-connecting through traces on the printed circuit board. These traces uniquely couple a field of connectors between the input communication line and equipment line connectors without using any external wires. In certain applications not requiring surge protection the circuit board will serve as a cross-connect field only.

In one aspect, the printed circuit board is mounted in a housing that provides additional support to the printed circuit board, isolates the leads of the surge protectors from external contact, and provides an attachment to mount the assembly in a working environment.

The present invention eliminates one or more of the protector block, cross-connect block, and associated wire wrapping for assemblies requiring surge protection and/or cross-connecting on multi-line communications cables. Consequently, production time, manufacturing cost, and both labor and component costs are reduced, while also eliminating unnecessary wire connections and manufacturing processes. Furthermore, the electrical connection between the surge protectors and the cables is made through traces within the printed circuit board. This provides for high quality connections, avoids the likely manufacturing defects that are commonly associated with a manual wire wrapping, cabling, or flow soldering process. The connector sockets allow easy connection and disconnection of incoming and outgoing cables as needed. Yet another benefit of the invention is that industry standard surge protector modules may be accommodated without modification.

Other advantages and objectives of the invention are described or will otherwise be apparent from the following description of the preferred embodiments of the invention as illustrated in the accompanying drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a partial exploded view of the prior art protector block assembly showing the relationship between the protector block, the printed circuit board and the metal hood;

FIG. 2A is a perspective view of a preferred embodiment of the present invention of a printed circuit board assembly for coupling a plurality of surge protector modules to a plurality of communication lines;

FIG. 2B is a conceptual wire schematic of the preferred embodiment of the present invention of a printed circuit board assembly for coupling a plurality of surge protectors modules to a plurality of communication lines;

FIG. 3C is an exploded view of a multi-layered printed circuit board showing the three (3) one ounce traces with common end points;

DETAILED DESCRIPTION OF THE INVENTION

Figure 3A:
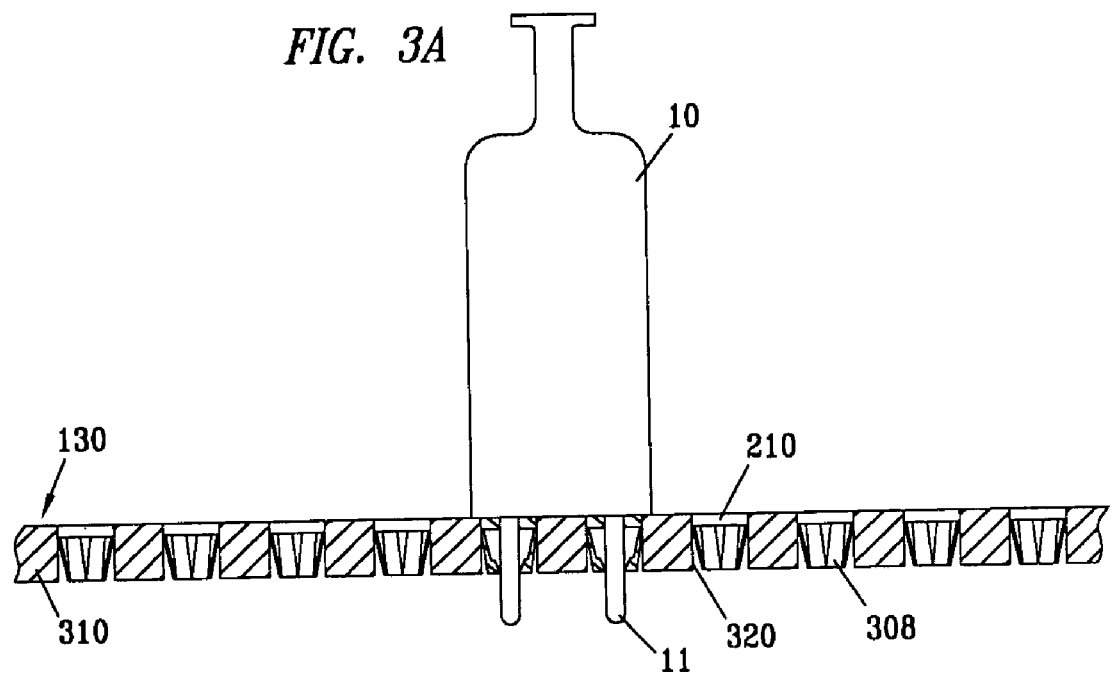
FIG. 3A is a cross sectional view of the multi-layer printed circuit board showing the dielectric layers with plated through holes and metal sockets that form a compression fit with those plated through holes.

FIG. 1 is a partial exploded view of the prior art protector block assembly 100 including a protector block 120, a printed circuit board 130 and a metal cover 140. The prior art protector block assembly 100 is described in more detail in U.S. Pat. No. 5,457,593, which is hereby incorporated by reference for all purposes. The prior art demonstrates the way a plurality of communication lines 52 are connected to surge protector modules 10 as a solution to the common need to wire wrap each line to the surge protector 10. The purpose of the protector block 120 is to provide a rigid structure in which a plurality of surge protector modules 10 can be mounted 124 and establish a unique electrical connection between the block 120 and the printed circuit board 130.

The electrical connection between the printed circuit board 130 and the protector block 120 is obtained through a plurality of wire wrap pins 122 of the protector block 120 and an equivalent number of receiving sockets 132 corresponding on the printed circuit board 130. Through these sockets and their corresponding traces, each lead of the surge protectors is electrically connected to a corresponding communication wire. Traces (not shown) within the printed circuit board 130 electrically couple the appropriate incoming and outgoing communication lines 52 coupled to the printed circuit board 130 by way of industry standard connector 40 to the appropriate pins 11 of the surge protectors 10 that are mounted on the protector block 120.

FIG. 2A is a perspective view of a preferred embodiment of the present invention of a printed circuit board assembly 200 for coupling a one or more surge protector modules 10 to one or more communication lines 52. In the assembly 200, the communication lines 52 and surge protector modules 10 are directly mounted to the printed circuit board 130. In this embodiment, metal sockets 210 and industry standard connectors 220, at "A" and "D", are formed on one side of the printed circuit board 130 for receiving, accepting, holding, fitting, securing, supporting, holding, grasping, retaining, and establishing an electrical connection with one or more surge protectors 10. The printed circuit board 130 both supports and maintains each electrical connection between each protector module 10 and its associated communication lines 52.

Use of the printed circuit board 130 as a receptacle for and direct connection with one or more protector modules 10 eliminates the need for the protector block 120, wire wrap pins 122, and associated pin receptacles 132 in the printed circuit board 130 of the prior art assembly 100 (shown in FIG. 1). Also eliminated is the need for a metal cover 140, used to secure the protector block 120 to the prior art printed circuit board 130. The inter-connections from the connectors 220 to the surge protector modules 10 will be better explained in the following discussion of the remaining figures.

While the embodiment of FIG. 2A illustrates sockets 210 for receiving, connecting, accepting, holding, fitting, securing, holding, grasping, retaining and supporting surge protectors 10 having a five pin configuration, at "B" (shown in FIGS. 2A and 2B), the invention also includes having sockets 210 for receiving and connecting surge protectors 10 having different pin configurations (not shown). For example, one common alternate configuration includes a surge protector having a sixth pin in addition to the five described herein. The sixth pin is for carrying an alarm signal whenever a surge protector 10 shorts a transient to ground.

In the preferred embodiment, a printed circuit board 130 is mounted to a frame 250 that offers mechanic support and provides a secure surface for mounting a ground terminal 230. The frame can be metallic or non-metallic. In the preferred embodiment, the printed circuit board assembly 200 includes a metallic frame 250. The frame 250 will be connected to the printed circuit board 130 at each corner 252 and will be electrically connected to the ground planes (not shown) on the board 130. The ground terminal 230 will in turn be mounted directly to the metallic frame 250. Placement of terminal on the frame 250 will vary, depending on customer application.

FIG. 2B is a conceptual wire schematic of the preferred embodiment found in FIG. 2A containing a circuit showing the connections between the industry standard connectors "A" through "D" and a surge protector 10 on a printed circuit board assembly 200 for coupling a plurality of surge protectors modules to a plurality of communication lines. Referring now to FIG. 2B, connectors "A" through "D" are shown in series. Surge protector "C" is shown electrically coupling traces and/or runs 350 (as seen in FIG. 3C) in series with the incoming line and outgoing equipment connectors, "A" and "D" respectfully. Maintaining these connections, in series, allows for easy and efficient coupling without having to use many additional traces and/or runs.

FIG. 3A is a cross sectional view of the multi-layer printed circuit board 130 according to the present invention wherein a multi-layer circuit board 130 includes a plurality of plated through holes 320. The multi-layer printed circuit board 130 is fabricated from multiple layers of dielectric material 310 that are bonded together using commonly known techniques in the art. In the preferred embodiment, the dielectric material includes fiberglass. Each layer 310 of the multi-layer printed circuit board 130 is also fabricated with patterns of metal traces (not shown) or "runs" using a conventional subtractive process which is also commonly known in the art and as described in U.S. Pat. No. 5,457,593. In the preferred embodiment, the metal traces (not shown) contain an enhanced copper content for sustaining high conductivity.

Figure 3B:
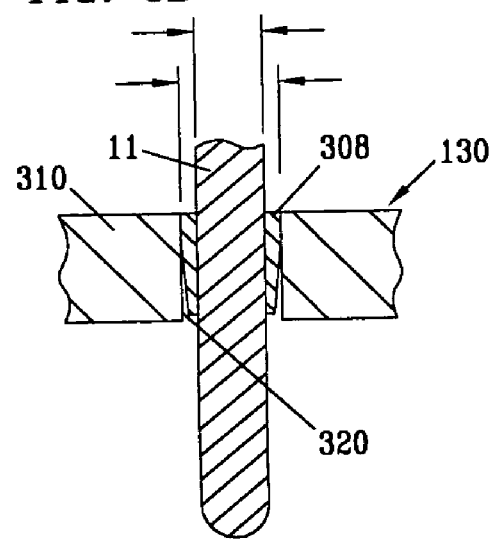
FIG. 3B is a cross sectional view of a pin fitting into a metal socket creating a compression fit.

FIG. 3B is a cross sectional view of a surge protector module pin 11 fitting into a metal socket 210 of FIG. 2 for creating a compression fit. Referring now to FIG. 3B, a unique compression fit is formed around a surge protector module pin 11. Each plated through hole 320 and the surface of the multi-layer printed circuit board 130 receives, accepts, secures, holds, supports and retains an expandable metal socket 210 that is pressed or soldered into the plated through hole 320, to establish an interference fit or soldered connection, respectively. Whenever a pin 11 is inserted into the socket 210, the socket expands and forms a compression fit around the surge protector module pin 11. The compression fit is formed by a socket having a plurality of metal fingers 308 that are forced to expand and accept a pin 11 that is inserted into the socket 210. Each Metal finger 308 of the socket 210 reacts as a spring that resist expansion that is due to the insertion of the pin 11 and is designed to grasp, secure and retain the surge protector pin 11. The compression fit electrically couples each surge protector pin 11 with each metal socket 210. The interference or soldered connection forms an electrical couple between each metal socket 210 and each plated through hole 320. Together, the two couples maintain all electrical connection between the surge protector pin and the plate through hole as well as securing the surge protector pin 11 and surge protector to the printed circuit board 130.

At least one surge protector module 10 is similarly secured, attached, supported, held, retained and electrically connected to a plurality of metal sockets 210 on the printed circuit board 130. Each socket 210, and therefore, each pin 11 of the surge protector modules 10 is electrically connected to the appropriate conductive metal trace 350 (similar to what is seen in FIG. 3C). This metal trace 350 electrically connects tip and ring pins of the surge protector 10 to the corresponding connector 220 or connectors to interface with the appropriate communication tip or ring wires 64 (as shown in FIG. 1) as is typically known in the art, and particularly, set out in U.S. Pat. No. 5,457,593.

FIG. 3C is an exploded view of a multi-layered printed circuit board showing a trace with multiple runs 350 with common end points 340 and 330. The precise pattern and weight of the metal trace or run 350 will depend, among other things, on the placement of the connector sockets 220, the connector pin assignments for the wires of the cables 50, and the number of surge protector modules 10. In the preferred embodiment, the invention includes a trace containing three (3) runs 350, each run 350 being a one ounce run 350, residing on different layers 310 and having common end points 340 and 330 instead of a single heavier three ounce trace (not shown) containing no runs. A trace made of multiple runs 350 having less copper content are less expensive than single and heavier trace for carrying large current surges from induced power signals without breaking down. An example of a single heavier trace is described in U.S. Pat. No. 5,457,593. Therefore, the versatility of the present invention allows for varying the number of runs 350 having common end points 340 and 330 and/or the copper content (i.e. weight of the trace) to accommodate different applications or cost objectives of the customer.

Multiple printed circuit board layers 310 are used to separate the numerous traces and/or runs 350 in the preferred embodiment and to keep the metal traces and/or runs 350 from overlapping or touching. A series of design iterations is typically used to optimize the metal trace patterns on each insulating printed circuit board layer 310 to minimize the number of layers 310 and traces and/or runs required for each design of a protector module printed circuit board assembly 200. In general, finding optional trace and/or run patterns are known by those skilled in the art of circuit board design. While the preferred embodiment of FIG. 3C illustrates a total of 3 underlying printed circuit board layers 310, the actual number of layers 310 and corresponding metal runs depend on design requirements as known by those skilled in the art and customer preference.

Figure 4A:
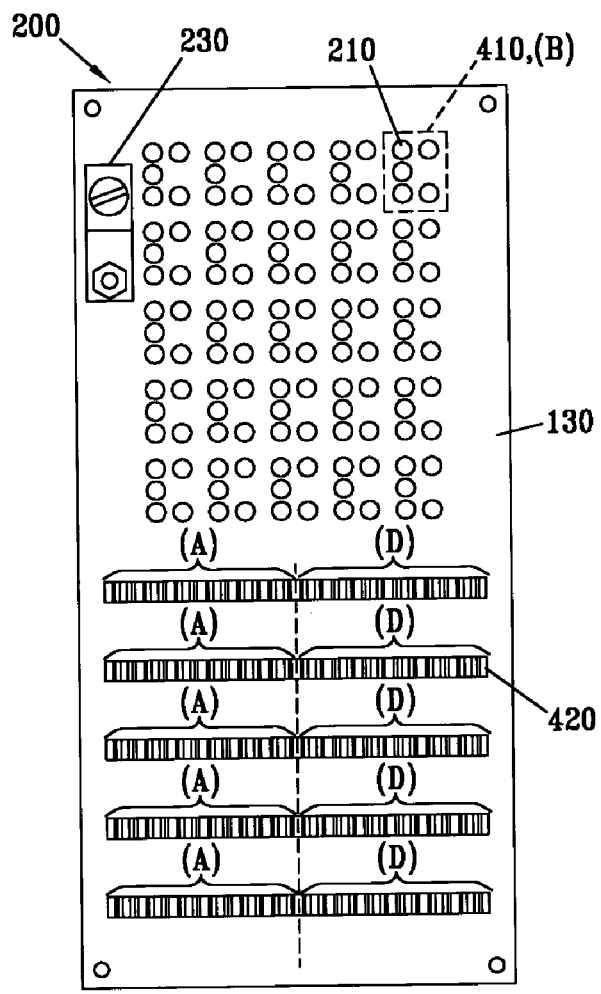
FIG. 4A is a front elevation view of one embodiment of a printed circuit board assembly according to the present invention.

FIG. 4A is a front elevation view of a printed circuit board assembly 200 according to the present invention. Referring now to FIG. 4, a multi-layer printed circuit board 130 includes a plurality of surge protector sockets 210, connector sockets 420, at "A" and "D", and a ground terminal 230. In this embodiment, the surge protector receptacles 210 are formed to receive the pins 11 of surge protector module 10 having an industry standard pin arrangement. As may be seen, a plurality of surge protectors to fit on a portion of one side of the printed circuit board 130.

In the preferred embodiment, the surge protector module sockets include a 5-pin configuration. The five protector pin sockets 210 that are grouped together on the printed circuit board 130 form a plurality of C-shaped configurations 410, at location "B". The configuration, need not be C-shaped 410, since the shape depends solely on the configuration of pins 11 on a surge protector module 10 being used. As an example, an alternate configuration for surge protector modules 10 includes a sixth pin (not shown) which is used to activate an alarm (not shown) whenever a transient signal that exceeds a specified level on the tip or ring communication lines 64 is being shorted to ground by way of the ground terminal 230.

The plurality of female connector sockets 420, at "A" and "D", residing on the front side of the multi-layer printed circuit board 130 serve dual purposes: they receive incoming, at "A", and outgoing, at "D", communication lines 52. Furthermore, the printed circuit board 130 of the present invention can accommodate any communication line connectors, including but not limited to male or female connectors, depending on application and customer. These communication lines 52 (as shown in FIG. 1) are often connected to mating connectors 220 (as shown in FIG. 2) before interfacing with other devices. The connector sockets 220 interface directly with the industry standard connector 40, therefore, they provide an easy and quick manner to connect a communication line 52 to a printed circuit board 130.

In the preferred embodiment, the invention can accommodate, but is not limited to any of the following displacement connectors: punch down, screw, 25-pin inline, or insulation displacement connectors. Furthermore, each connector socket 220 provides an electrical connection between numerous communication wire pairs (not shown) and an equivalent number of traces containing multiple runs 350 (as seen in FIG. 3C). The traces (not shown) electrically couple each incoming "tip" and "ring" communication wire pair 64 (as seen in FIG. 1) to the corresponding surge protector pins 11, which in turn electrically couples the surge protector 10 to an outgoing "tip" and "ring" communication wire pair 64 (as seen in FIG. 1). This, in turn, allows each wire pair within the communication line 52 to be electrically coupled to a surge protector module 10 to help protect it from transient voltage surges. The versatility of the printed circuit board assembly 200 allows any number of traditional and untraditional pair configurations to be accommodated without specialized tooling, depending on application and customer.

Figure 4B:
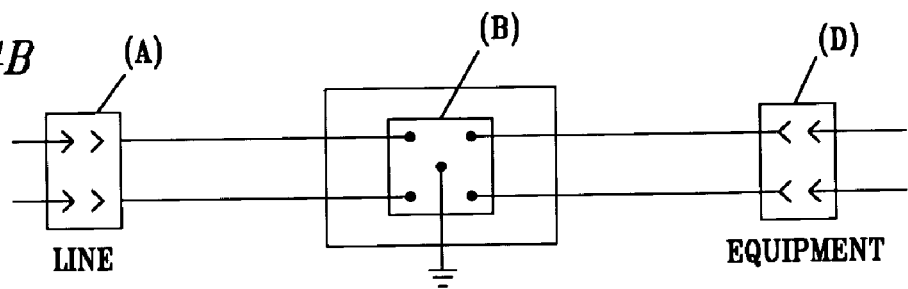
FIG. 4B is a conceptual wire schematic of one embodiment of a printed circuit board assembly according to the present invention.

FIG. 4B is a conceptual wire schematic of one embodiment found in FIG. 4A containing a circuit showing the connections between the two sets of female connectors "A" and "D" and a surge protector 10 on a printed circuit board assembly 200 according to the present invention. Referring now to FIG. 4B, connectors "A" through "D" are shown in series. Surge protector "C" is shown electrically coupling traces and/or runs 350 (as seen in FIG. 3C) in series with the incoming (line) female connectors, at "A", and outgoing (equipment) female connectors, at "D", that reside on the front side of the multi-layer printed circuit board 130. Maintaining these connections, in series, allows for easy and efficient coupling without having to use many additional traces and/or runs.

Figure 5A:
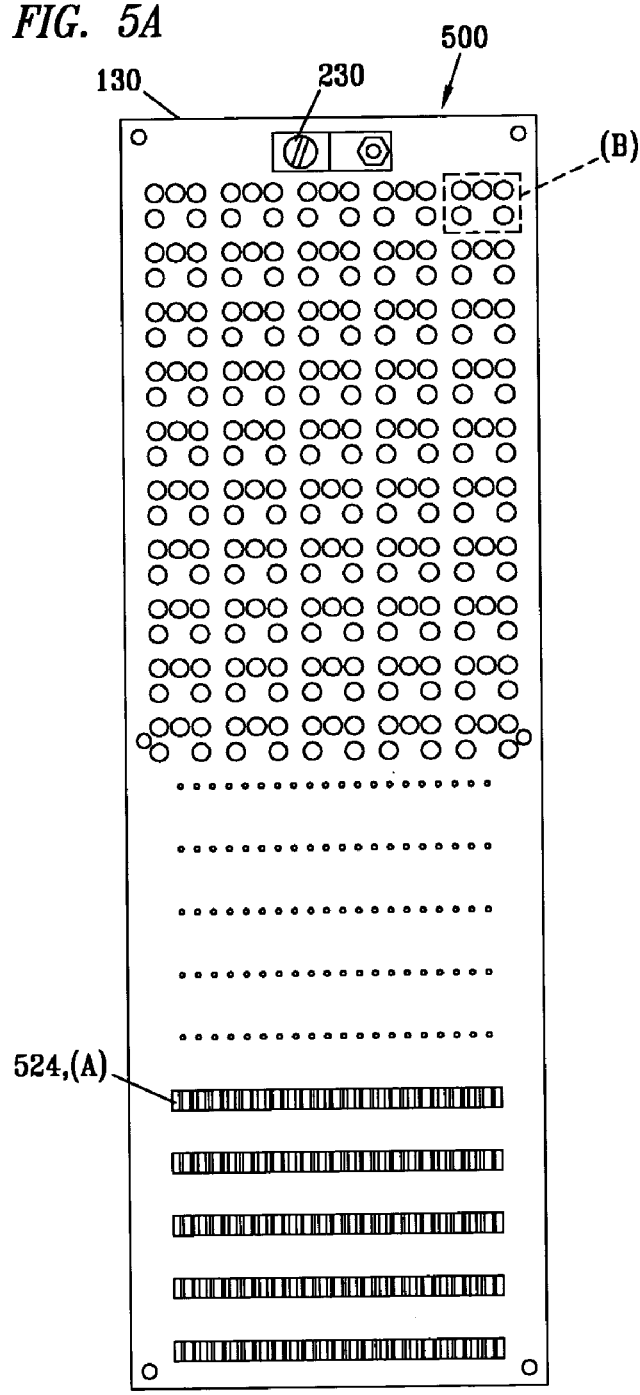
FIG. 5A is a front elevation view of an alternate embodiment of a printed circuit board assembly according to the present invention.

FIG. 5A is a front elevation view of a first alternate embodiment of a printed circuit board assembly 500 according to the present invention wherein insulation displacement connectors 524, at "A", are mounted directly to the multi-layer printed circuit board 130. Here, no mating connector 220 (as seen in FIG. 2) is necessary, as the communication line 52 (shown in FIG. 1) is connected directly to the connector 524, at "A", on the multi-layer printed circuit board 130. The ground terminal 230 is mounted on the front side of this alternative printed circuit board assembly 500 for easy convenience. As before, traces and/or runs 350 connect the sockets 210 to the corresponding pins of the displacement connectors 524.

Figure 5B:
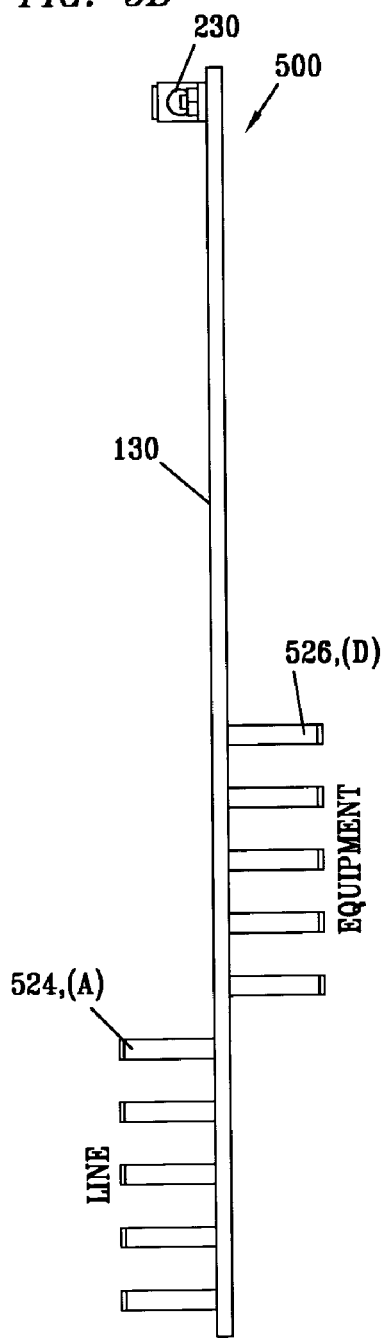
FIG. 5B is a side view of the first alternate embodiment of a printed circuit board assembly according to the present invention.

FIG. 5B is a side view of the first alternate embodiment of a printed circuit board assembly 500 of FIG. 5A according to the present invention. Referring now to FIG. 5B, insulation displacement connectors 524, at "A", and 526, at "D", are mounted on both sides of the printed circuit board 130. The insulation displacement connectors 524 mounted on one side for receiving incoming, at "A", and outgoing, at "D", communication lines 52 (as shown in FIG. 1). The insulation displacement connectors 526, at "D", mounted on the other side are for receiving outgoing communication equipment lines (not shown).

Figure 5C:
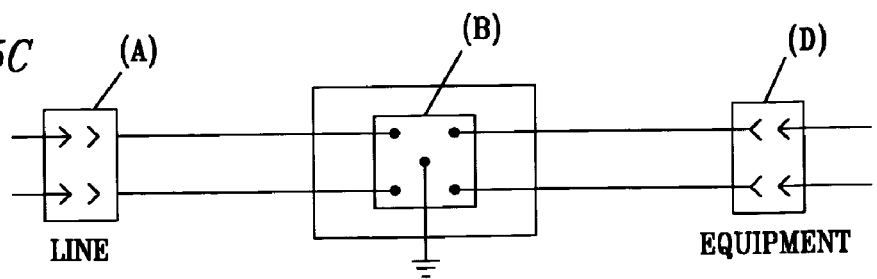
FIG. 5C is a conceptual wire schematic of the first alternative embodiment of a printed circuit board assembly according to the present invention.

FIG. 5C is a conceptual wire schematic of the first alternate embodiment found in FIGS. 5A and 5B containing a circuit showing the connections between two sets of insulation displacement connectors "A" and "D" and a surge protector 10 on a printed circuit board assembly 200 of the present invention. Referring now to FIG. 5C, insulation displacement connectors "A" and "D" are shown in series. Surge protector "C" is shown electrically coupling traces and/or runs 350 (as seen in FIG. 3C) in series with the incoming (line) insulation displacement connectors, at "A", and outgoing (equipment) insulation displacement connectors, at "D", that reside on opposite sides of the multi-layer printed circuit board 130. Maintaining these connections, in series, allows for easy and efficient coupling without having to use many additional traces and/or runs.

Figure 6A:
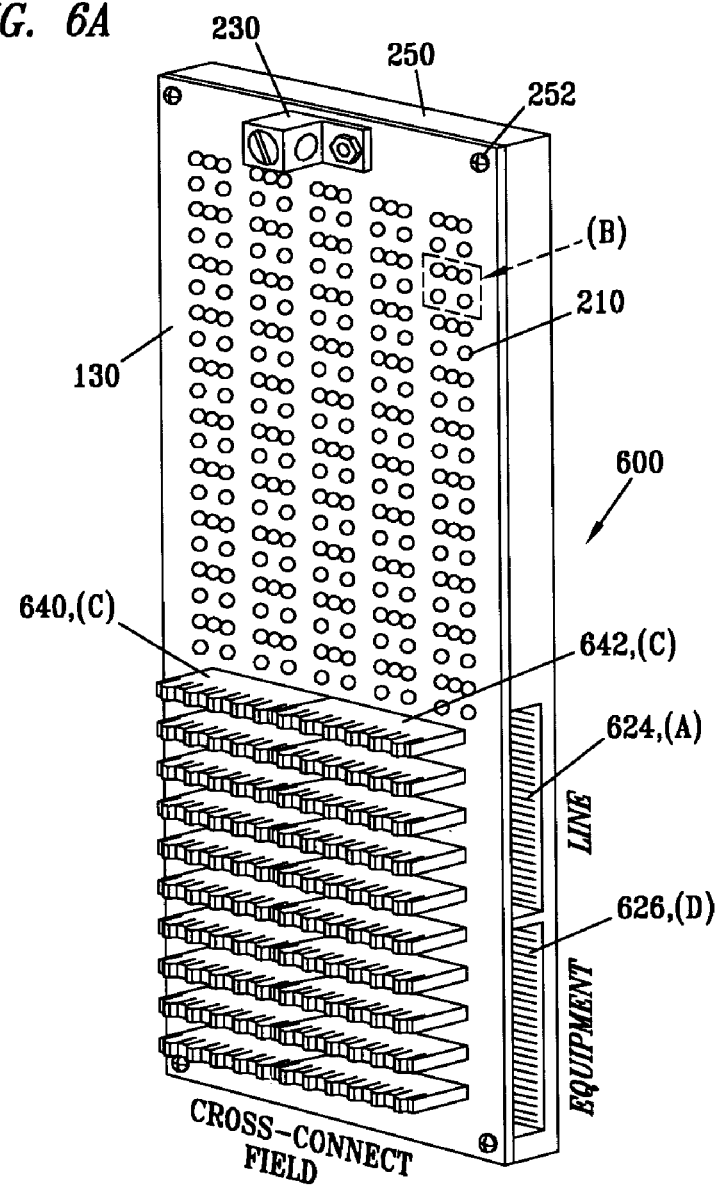
FIG. 6A is a perspective view of the second alternate embodiment of a printed circuit board assembly according to the present invention.

FIG. 6A is a perspective view of a second alternate embodiment of a printed circuit board assembly 600 according to the present invention. Referring now to FIG. 6A, a multi-layer printed circuit board 130 includes incoming connector 624 and outgoing connector 626 sockets at "A" and "D", as well as, sockets 210 and 642. In general, the connectors at "A" and "D" are for connecting incoming and outgoing communication lines 52 (as shown in FIG. 1), sockets 210 are for receiving surge protectors, and sockets 642 are for receiving cross-connected communication lines (not shown). Assembly 600 also includes a rigid support frame 250.

Figure 6B:
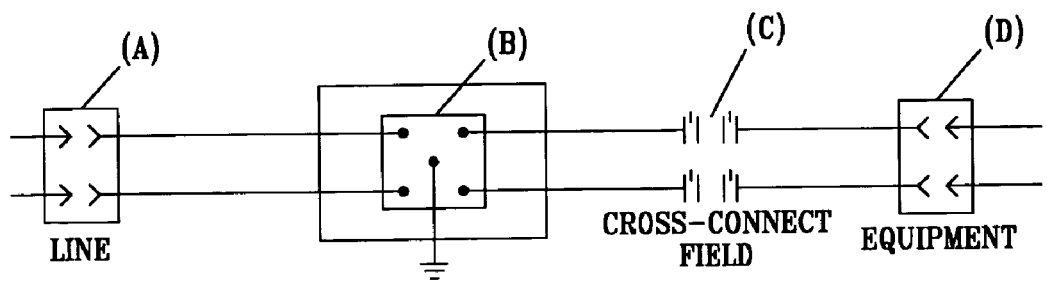
FIG. 6B is a conceptual wire schematic of the second alternate embodiment containing a printed circuit board assembly having cross-connect capabilities according to the present invention.

Cross-connect capabilities of assembly 600 require additional traces and/or runs (not shown) to be uniquely incorporated into the multi-layer printed circuit board 130. These traces and/or runs (not shown) electrically couple a field of connectors 640 between the input line connectors 624 and the equipment line 626 connectors (as shown in FIG. 6B). These traces and/or runs also allow the cross-connectors to be mounted on the printed circuit board 130, thereby, eliminating the need for a cross-connector block that was required in the prior art.

In the preferred embodiment of this alternate embodiment, the incoming communication line connector 624, at "A", and equipment line connector 626, at "D", are attached directly to the back side of the printed circuit board 130 using 90° 25 pair line connectors. This allows more space on the printed circuit board 130 to accommodate the plurality of cross-connectors. Furthermore, the cross-connection capabilities are enhanced by using standard punch down connectors (shown as 640 at location "C" FIGS. 6A and 6B) that are connected at 90° to the printed circuit board 130. Any number of configurations may be accommodated, depending on application and customer preference.

In this second alternative embodiment, a printed circuit board 130 is mounted to a metallic frame 250 that offers mechanical support and mounting options for the punch down connectors 640, and provides a secure surface for mounting a ground terminal 230. The frame can be a metallic or non-metallic frame. In the preferred embodiment of this alternate embodiment, the printed circuit board includes a metallic frame. The frame 250 will be connected to the printed circuit board 130 at each corner 652 and will be electrically connected to the ground planes (not shown) on the board 130. The ground terminal 230 will in turn be mounted directly to the metallic frame 250. Placement of terminal on the frame 250 will vary, depending on customer application.

FIG. 6B is a schematic of the second alternate embodiment found in FIG. 6A containing a circuit showing the connections between connectors "A" through "D" and cross-connections on a printed circuit board assembly 600 according to the present invention. Referring now to FIG. 6B, connectors "A" through "D" are shown in series. Cross connection "C" is shown electrically coupling traces and/or runs 350 in series with the incoming and outgoing connectors, "A" and "D", and the surge protector sockets "B". Maintaining these connections, in series, allows for easy and efficient coupling without having to use many additional traces and/or runs.

In this embodiment, the preferred cross-connector is a punch down connector. Cross-connectors 640 are electrically coupled either before and/or after the surge protector sockets 210 as long as they are between the incoming and outgoing communication line connectors 624 and 626. The preferred location to couple the cross-connectors in this embodiment is after the surge protector. This insures that the outgoing cross-connection communication line is free of transient voltage surges. The arrangement of cross-connectors in FIG. 6B is used to illustrate one aspect of the described embodiment and is not intended to limit alternate designs. Placement of the cross-connectors may be determined by application or customer preference. Thus, FIG. 6B demonstrates that any number of configurations can be accommodated as long as the cross-connections are electrically coupled in series to traces found between the input and output connectors.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. An assembly for receiving at least one surge protector, comprising:
at least two metal protector pin connectors disposed on a printed circuit board for receiving and electrically connecting one or more pins of the at least one surge protector;
at least one communication line connector on the printed circuit board for electrically connecting to a communication line;
at least one trace within or on the printed circuit board and having at least one run generally in a plane through which one or more of said pins of the surge protector pass when received into said protector pin connector, the trace electrically connecting one of said protector pin connectors to the communication line connector; and
at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

2. The assembly of claim 1 wherein the metal protector pin connector secure a plurality of surge protectors.

3. The assembly of claim 2 wherein the metal protector pin connector has a compression fit around each of the pins of the surge protector.

4. The assembly of claim 1 wherein each metal protector pin connector resides in a plated through hole on the printed circuit board.

5. The assembly of claim 4 wherein the metal protector pin connector has an interference fit with the plated through hole.

6. The assembly of claim 4 wherein the metal protector pin connector has a soldered connection with the plated through hole.

7. The assembly of claim 4 wherein the metal protector pin connectors accept at least one pin of each surge protector module by expanding to form a compression fit between at least one pin of the surge protector module and the metal protector pin connector.

8. The assembly of claim 7 wherein a unique electrical couple is created between each plated through hole, metal protector pin connector and surge protector module pin resulting in an electrical connection between the surge protector module pin and the designated trace.

9. The assembly of claim 8 wherein the electrical connection between the surge protector module pin and the designated trace is maintained by the compression fit.

10. The assembly of claim 1 wherein an additional trace electrically couples to the trace between the communication line connector and the metal protector pin connector.

11. The assembly of claim 10 wherein a cross-connector is electrically coupled to the additional trace such that it has cross-connect capabilities.

12. The assembly of claim 1 wherein the incoming and outgoing communication line connectors are on the same side of the printed circuit board.

13. The assembly of claim 12 wherein the incoming and outgoing communication line connectors are further on the same side of the printed circuit board as the surge protector.

14. The assembly of claim 12 wherein the incoming and outgoing communication line connectors are on opposite sides of the printed circuit board as the surge protector.

15. The assembly of claim 1 wherein at least one of the incoming and outgoing communication line connectors is an insulation displacement connector.

16. The assembly of claim 1 wherein the surge protector has five pins.

17. The assembly of claim 1 wherein the pins of the surge protector are arranged in at least two non-aligned rows.

18. A surge protector assembly, comprising:
at least one metal protector pin connector disposed on a multi-layer printed circuit board for electrically connecting one or more pins of a surge protector;
at least one incoming connector disposed on a multi-layer printed circuit board for electrically connecting to an incoming communication line having one or more leads;
at least one outgoing connector disposed on a multi-layer printed circuit board for electrically connecting to an outgoing communication line having one or more leads; and
one or more traces on or within the multi-layer printed circuit board, the traces electrically connecting the protector pin connector to a corresponding connector establishing an electrical path between at least one lead of the incoming and outgoing communication lines and a corresponding surge protector pin, at least one of said traces including at least two runs electrically in parallel such that they electrically connect a particular one of said protector pin connector to a particular one of either or both of said incoming or outgoing communication lines.

19. The assembly of claim 18 wherein at least two runs are copper.

20. The assembly of claim 19 wherein each of the at least two copper runs are disposed on a separate layer of the multi-layer printed circuit board.

21. The assembly of claim 20 wherein each of the traces has at least one ounce copper content to conduct high current surges.

22. The assembly of claim 18 wherein the multi-layer printed circuit board is mounted on a frame for support.

23. The assembly of claim 18 wherein the metal protector pin connector of the multi-layer printed circuit board has a compression fit around each of the pins of the surge protector module.

24. The assembly of claim 18 wherein each metal protector pin connector resides in a plated through hole on the printed circuit board.

25. The assembly of claim 24 wherein each metal protector pin connector has an interference fit with the plated through hole.

26. The assembly of claim 25 wherein each metal protector pin connector has a soldered connection with the plated through hole.

27. The assembly of claim 24 wherein the metal protector pin connectors accept at least one pin of each surge protector module by expanding whereby there is a compression fit between at least one pin of the surge protector module and the metal protector pin connector.

28. The assembly of claim 27 wherein a unique electrical couple is created between each plated through hole, metal protector pin connector and surge protector module pin resulting in an electrical connection between the surge protector module pin and the designated trace.

29. The assembly of claim 28 wherein the electrical connection between the surge protector module pin and the designated trace is maintained by the compression fit.

30. The assembly of claim 18 wherein the multi-layer printed circuit board contains at least one ground plane for discharging current surges.

31. The assembly of claim 30 wherein at least one of the connectors designated for each surge protector is electrically connected to the ground plane by the trace.

32. The assembly of claim 31 wherein the ground plane accepts and discharges transient signals connected to it by the surge protector during a current surge that exceeds a specified level.

33. The assembly of claim 18 wherein the connectors are disposed either on one of the front or back of the printed circuit board.

34. The assembly of claim 33 wherein the incoming connector is an insulation displacement connector.

35. The assembly of claim 33 wherein the outgoing connector is an insulation displacement connector.

36. The assembly of claim 33 wherein the incoming connector is a punch down connector.

37. The assembly of claim 33 wherein the outgoing connector is a punch down connector.

38. The assembly of claim 33 wherein the incoming connector is a multiple-pin inline connector.

39. The assembly of claim 33 wherein the outgoing connector is a multiple-pin inline connector.

40. The assembly of claim 33 wherein the incoming connector is a screwdown connector.

41. The assembly of claim 33 wherein the outgoing connector is a screwdown connector.

42. A surge protector assembly, comprising:
a multi-layer printed circuit board for connectively accepting a plurality of pins of a surge protector;
a plurality of metal protector pin connectors disposed on the multi-layer printed circuit board;
a plurality of insulation displacement connectors disposed on the multi-layer printed circuit board for connectively accepting an incoming and an outgoing cable having a plurality of leads; and
a plurality of traces within or on the multi-layer printed circuit board, the traces each having two end points and at least two electrically parallel runs coupled to the end points for electrically connecting each of the protector pin connectors to a corresponding insulation displacement connector, such that there is a signal path between each lead of the incoming and outgoing cables and a corresponding surge protector pin.

43. The assembly of claim 42 wherein each of the at least two runs are on a separate layer within the multi-layer printed circuit board.

44. A surge protector assembly, comprising:
a plurality of metal protector pin connectors disposed on a multi-layer printed circuit board for connectively accepting a plurality of pins of a surge protector;
a ground plane within or on the multi-layer printed circuit board for connectively accepting and discharging a transient signal from the surge protector during a current surge that exceeds a specified level;
at least one incoming line connector disposed on a multi-layer printed circuit board for connectively accepting an incoming cable having a plurality of leads;
at least one outgoing line connector disposed on a multi-layer printed circuit board for connectively accepting an incoming cable having a plurality of leads;
a first trace within or on the multi-layer printed circuit board, the first trace having two end points and at least two electrically parallel runs coupled to the end points for electrically connecting each of the protector pin connectors to a corresponding line connector, such that there is a signal path between each lead of the incoming and outgoing cables and a corresponding surge protector pin;
a second trace disposed on or within the multi-layer printed circuit board, the second trace forming an electrical cross connection between the incoming or outgoing communication line connectors and the metal protector pin connector; and
a frame having a ground terminal for electrically connecting the surge protector to ground, where the metallic frame connectively accepts the multi-layer printed circuit assembly.

45. The assembly of claim 44 wherein the metal protector pin connectors secure one or more surge protectors.

46. The assembly of claim 45 wherein the metal protector pin connectors have a compression fit around each of the pins of the surge protector.

47. The assembly of claim 44 wherein each metal protector pin connector reside in a plated through hole on the printed circuit board.

48. The assembly of claim 47 wherein at least one metal protector pin connector of the multi-layer printed circuit board has an interference fit with at least one plated through hole.

49. The assembly of claim 48 wherein a unique electrical couple is created between each plated through hole, metal protector pin connector and surge protector module pin resulting in an electrical connection between the surge protector module pin and the designated trace.

50. The assembly of claim 49 wherein the electrical connection between the surge protector module pin and the designated trace is maintained by a compression fit.

51. The assembly of claim 44 wherein the runs comprise copper.

52. The assembly of claim 51 wherein each of the at least two copper runs are disposed on a separate layer within the multi-layer printed circuit board.

53. The assembly of claim 44 wherein at least one of the metal protector pin connectors designated for each surge protector is electrically connected to the ground plane.

54. The assembly of claim 44 wherein the line connector accepts and establishes a good electrical connection with a first mating connector.

55. The assembly of claim 54 wherein the first mating connector contains a multi-line cable with multiple leads.

56. The assembly of claim 44 wherein the incoming line connector is an insulation displacement connector.

57. The assembly of claim 44 wherein the outgoing line connector is an insulation displacement connector.

58. The assembly of claim 44 wherein the incoming line connector is a punch down connector.

59. The assembly of claim 44 wherein the outgoing line connector is a punch down connector.

60. The assembly of claim 44 wherein the incoming line connector is a 25-pin inline connector.

61. The assembly of claim 44 wherein the outgoing line connector is a 25-pin inline connector.

62. The assembly of claim 44 wherein the incoming line connector is a screwdown connector.

63. The assembly of claim 44 wherein the outgoing line connector is a screwdown connector.

64. The assembly of claim 44 wherein the electrical cross-connection includes a multiple pair connector placed 90° to the printed circuit board.

65. The assembly of claim 44 wherein the outgoing line connector comprise standard communication and equipment connectors.

66. The assembly of claim 44 wherein the cross-connector are coupled between the communication and the equipment connectors.

67. A method of providing surge protection to a plurality of communication lines comprising:
forming input and output connectors on the communication lines;
connecting the input connectors to a multi-layer printed circuit board;
connecting the output connectors to a multi-layer printed circuit board; and
connecting one of a five pin or six pin surge protector assembly to the multi-layer printed circuit board, wherein traces on the multi-layer printed circuit board electrically connect pins of the surge protector assembly in series with the corresponding input and output pins of the input and output connectors, respectively, and wherein at least one of the traces has at least two electrically parallel runs.

68. The method of claim 67 further including the step of connecting a first cross-connect connector lead to a second cross-connect connector lead wherein the first and second cross-connect leads are connected to a first and second trace that is coupled to a first and second input line.

69. The method of claim 67 further including the step of connecting a first cross-connect connector lead to a second cross-connect connector lead wherein the first and second cross-connect leads are connected to a first and second trace that is coupled to a first and second output line.

70. An assembly for receiving at least one surge protector, comprising:
at least one metal protector pin connector having a tubular portion mounted to and extending directly into a trace-containing layer of a printed circuit board for electrically connecting one or more pins of the at least one surge protector;
at least one communication line connector disposed on the printed circuit board for electrically connecting to a communication line;
at least one trace within or on the printed circuit board, the trace electrically connecting the protector pin connector to the communication line connector; and
at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

71. An assembly for receiving at least one surge protector, comprising:
at least two metal protector pin connectors mounted directly to and extending directly into a trace-containing layer of a printed circuit board for electrically connecting one or more pins of the at least one surge protector;
at least one communication line connector disposed on the printed circuit board for electrically connecting to a communication line;
at least one trace within or on the printed circuit board, the trace electrically connecting the protector pin connector to the communication line connector; and
at least one trace within or on the printed circuit board electrically connecting one of said protector pin connectors to ground, said at least one trace configured to short shorting a transient current to ground when the transient current exceeds a threshold level, wherein the at least one trace includes at least two conductive runs that are electrically coupled in parallel and disposed on a separate layer on or within the printed circuit board.

72. An assembly for receiving at least one surge protector, comprising:
at least one metal protector pin connector mounted directly to a trace-containing layer of a printed circuit board for electrically connecting one or more pins of the at least one surge protector, said connector having a length approximately equal to the thickness of said trace-containing layer of said printed circuit board;
at least one communication line connector disposed on the printed circuit board for electrically connecting to a communication line;
at least one trace within or on the printed circuit board, the trace electrically connecting the protector pin connector to the communication line connector; and
at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

73. An assembly for electrically connecting at least one surge protector pin to a communications line and a ground line, comprising:
- a surge protector connector disposed at least partially into a printed circuit board for directly receiving at least one surge protector pin;
- at least one communication line connector disposed on the printed circuit board for electrically connecting to a communication line;
- at least one trace within or on the printed circuit board for electrically connecting the surge protector pin to the communication line connector;
- the surge protector pin establishing an electrical connection with the at least one trace within the printed circuit board without a wire wrap pin; and
- at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

74. An assembly for electrically connecting at least one surge protector pin to a communications line and a ground line, comprising:
- a surge protector connector disposed on a printed circuit board for directly receiving at least one surge protector pin;
- at least one communication line connector disposed on the printed circuit board for electrically connecting to a communication line;
- at least one trace extending along a plane within or on the printed circuit board for electrically connecting the surge protector pin to the communication line connector;
- the surge protector pin establishing an electrical connection with the at least one trace within the printed circuit board without an intermediate wire wrap pin and wherein the surge protector pin is received within the surge protector connector with the longitudinal axis of the pin not extending parallel to the plane of the at least one trace; and
- at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

75. The assembly of claim 74, wherein the pin is received within the surge protector connector with the longitudinal axis of the pin extending substantially perpendicular to the plane of the at least one trace.

76. An assembly for connecting a surge protector to a communications line and a ground line, comprising:
- a surge protector having a plurality of electrical leads;
- a printed circuit board;
- at least one trace within or on the printed circuit board for electrically connecting each of the surge protector electrical leads to a communications line;
- a pin extending at least partially directly into the trace of the printed circuit board for electrically connecting each lead to the at least one trace of the circuit board; and
- at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

77. The assembly of claim 76, wherein the pin is not an intermediate wire wrap pin.

78. An assembly for receiving and removably electrically connecting at least one surge protector to a printed circuit board having a major plane and at least one trace within or on said printed circuit board, the trace having at least one run in a plane generally parallel with the plane of the printed circuit board, comprising:
- at least one communication line connector on the printed circuit board for electrically connecting the at least one trace to a communication line;
- at least one metal surge protector pin connector securely affixed to and electrically connected to the run of the trace of the printed circuit board, the metal surge protector pin connector having a receptacle portion for receiving and electrically connecting one or more pins of the at least one surge protector to the run of the trace;
- the receptacle portion of the surge protector pin connector being disposed with respect to the plane of the run of the trace such that when the surge protector pins are received into the receptacle portion of the protector pin connector, at least a portion of said pins passes through the plane of the run; and
- at least one trace within or on the printed circuit board electrically connecting one of said protector pin connectors to ground, said at least one trace shorting a transient current to ground when the transient current exceeds a threshold level, wherein the at least one trace includes at least two conductive runs that are electrically coupled in parallel and disposed on a separate layer on or within the printed circuit board.

79. The assembly of claim 78 wherein the receptacle portion of the metal protector pin connectors secure one or more surge protectors.

80. The assembly of claim 79 wherein the receptacle portion of the metal protector pin connectors has a compression fit around each of the pins of the surge protector.

81. The assembly of claim 78 wherein the receptacle portion of each metal protector pin connector resides in a plated through hole on the printed circuit board.

82. The assembly of claim 81 wherein the metal protector pin connector has an interference fit with the plated through hole.

83. The assembly of claim 81 wherein the metal protector pin connector has a soldered connection with the plated through hole.

84. The assembly of claim 81 wherein the metal protector pin connectors accept at least one pin of each surge protector module by expanding such that there is a compression fit between at least one pin of the surge protector module and the metal protector pin connector.

85. The assembly of claim 84 wherein a unique electrical couple is created between each plated through hole, metal protector pin connector and the surge protector module pin resulting in an electrical connection between the surge protector module pin and the designated trace.

86. The assembly of claim 85 wherein the electrical connection between the surge protector module pin and the designated trace is maintained by the compression fit.

87. The assembly of claim 78 wherein the at least two conductive runs are copper.

88. The assembly of claim 78 wherein an additional trace electrically couples to the trace between the communication line connector and the metal protector pin connector.

89. The assembly of claim 88 wherein a cross-connector is electrically coupled to the additional trace to form cross-connect capabilities.

90. A surge protector assembly, comprising:
- at least one metal protector pin connector disposed on a multi-layer printed circuit board for electrically connecting one or more pins of a surge protector;
- at least one incoming communication line connector on a multi-layer printed circuit board for electrically connecting to an incoming communication line having one or more leads;
- at least one outgoing communication line connector on a multi-layer printed circuit board for electrically connecting to an outgoing communication line having one or more leads; and
- one or more traces on or within the multi-layer printed circuit board, the traces electrically connecting the protector pin connector to a corresponding line connector establishing an electrical path between at least one lead of the incoming and outgoing communication lines and a corresponding surge protector pin, at least one of said traces including at least two runs electrically in parallel such that they electrically connect a particular one of said protector pin connectors to a particular one of either or both of said incoming or outgoing communication lines.

91. The assembly of claim 90 wherein the incoming and outgoing communication line connectors are on the same side of the printed circuit board.

92. The assembly of claim 91 wherein the incoming and outgoing communication line connectors are further on the same side of the printed circuit board as the surge protector.

93. The assembly of claim 91 wherein the incoming and outgoing communication line connectors are on opposite sides of the printed circuit board as the surge protector.

94. The assembly of claim 90 wherein at least one of the incoming and outgoing communication line connectors is an insulation displacement connector.

95. The assembly of claim 90 wherein the surge protector has five pins.

96. The assembly of claim 90 wherein the pins of the surge protector are arranged in at least two non-aligned rows.

* * * * *